United States Patent
Chen et al.

(10) Patent No.: US 8,115,582 B2
(45) Date of Patent: Feb. 14, 2012

(54) INDUCTOR TOPOLOGIES WITH SUBSTANTIAL COMMON-MODE AND DIFFERENTIAL-MODE INDUCTANCE

(75) Inventors: Chingchi Chen, Ann Arbor, MI (US); Michael Degner, Novi, MI (US); Feng Liang, Canton, MI (US)

(73) Assignee: Ford Global Technologies, Dearborn, MI (US)

( * ) Notice: Subject to any disclaimer, the term of this patent is extended or adjusted under 35 U.S.C. 154(b) by 0 days.

(21) Appl. No.: 12/903,249

(22) Filed: Oct. 13, 2010

(65) Prior Publication Data

US 2011/0080244 A1    Apr. 7, 2011

Related U.S. Application Data

(62) Division of application No. 11/533,992, filed on Sep. 21, 2006, now abandoned.

(51) Int. Cl.
*H01F 21/08* (2006.01)

(52) U.S. Cl. .................... 336/160; 336/84 R; 336/84 M; 336/90

(58) Field of Classification Search ................... 336/160, 336/90, 84 R, 84 M, 92, 96, 98
See application file for complete search history.

(56) References Cited

U.S. PATENT DOCUMENTS

| | | | |
|---|---|---|---|
| 1,717,347 A * | 6/1929 | Camilli ............................ 336/73 |
| 1,760,540 A * | 5/1930 | Brand .............................. 361/38 |
| 2,114,189 A * | 4/1938 | Kronmiller ................. 336/84 R |
| 2,897,463 A * | 7/1959 | Denham ......................... 336/65 |
| 3,617,966 A * | 11/1971 | Trench et al. ................... 336/61 |
| 4,085,395 A * | 4/1978 | Billerbeck et al. ............. 336/61 |
| 4,613,841 A | 9/1986 | Roberts |
| 4,914,381 A * | 4/1990 | Narod ....................... 324/117 R |
| 5,119,059 A | 6/1992 | Covi et al. |
| 5,155,676 A | 10/1992 | Spreen |
| 5,204,653 A | 4/1993 | Saitoh et al. |
| 5,313,176 A | 5/1994 | Upadhyay |
| 5,525,951 A | 6/1996 | Sunano et al. |
| 5,633,648 A * | 5/1997 | Fischer ......................... 343/788 |
| 5,731,666 A | 3/1998 | Folker et al. |
| 5,747,981 A | 5/1998 | Callanan |
| 5,783,984 A | 7/1998 | Keuneke |
| 5,793,273 A | 8/1998 | Yamaguchi et al. |
| 5,889,373 A * | 3/1999 | Fisher et al. ................... 315/307 |
| 5,926,083 A | 7/1999 | Asaoka |
| 5,977,853 A | 11/1999 | Ooi et al. |
| 6,078,242 A | 6/2000 | Tomita et al. |
| 6,191,675 B1 * | 2/2001 | Sudo et al. ....................... 336/96 |
| 6,191,676 B1 | 2/2001 | Gabor |
| 6,344,786 B1 * | 2/2002 | Chin .............................. 336/198 |

(Continued)

FOREIGN PATENT DOCUMENTS

DE    29912921 U    10/2000

(Continued)

*Primary Examiner* — Anh Mai
*Assistant Examiner* — Joselito Baisa
(74) *Attorney, Agent, or Firm* — Angela M. Bruneth; Frank Mackenzie

(57) ABSTRACT

An inductor includes a core that has a window (164). The core includes a first core member and a second core member. A first winding is coupled to the first core member and a second winding is coupled to the second core member. A shell surrounds the core. Pairs of gaps between the core and the shell provide flux paths.

3 Claims, 5 Drawing Sheets

U.S. PATENT DOCUMENTS

| | | | |
|---|---|---|---|
| 6,351,203 B1 * | 2/2002 | Mihara et al. | 336/90 |
| 6,480,088 B2 * | 11/2002 | Okamoto | 336/229 |
| 6,642,672 B2 | 11/2003 | Hu et al. | |
| 6,734,771 B2 * | 5/2004 | Okita et al. | 335/229 |
| 6,768,408 B2 | 7/2004 | Gilmore et al. | |
| 6,958,673 B2 * | 10/2005 | Suzuki | 336/208 |
| 7,030,724 B2 | 4/2006 | Pedersen et al. | |
| 7,132,812 B1 | 11/2006 | Wu et al. | |
| 7,307,375 B2 * | 12/2007 | Smith et al. | 313/31 |
| 7,868,724 B2 * | 1/2011 | Sicong et al. | 336/84 R |
| 2002/0175571 A1 | 11/2002 | Gilmore et al. | |
| 2002/0195973 A1 | 12/2002 | Hu et al. | |
| 2004/0017689 A1 | 1/2004 | Zhang et al. | |
| 2005/0286270 A1 | 12/2005 | Petkov et al. | |

FOREIGN PATENT DOCUMENTS

| | | |
|---|---|---|
| DE | 19932475 A1 | 2/2001 |
| EP | 0579962 B1 | 1/1994 |
| EP | 0865047 A1 | 9/1998 |
| JP | 11219832 A | 8/1999 |
| JP | 11340057 A * | 12/1999 |
| WO | WO 91/10285 A1 | 7/1991 |

* cited by examiner

INDUCTOR TOPOLOGIES WITH SUBSTANTIAL COMMON-MODE AND DIFFERENTIAL-MODE INDUCTANCE

CROSS REFERENCE TO RELATED APPLICATIONS

This application is a divisional of application Ser. No. 11/533,992, filed on Sep. 21, 2006, now abandoned incorporated by reference herein.

TECHNICAL FIELD

The present invention relates to vehicle and non-vehicle electronic and electrical systems and components. More particularly, the present invention is related to inductor topologies for common-mode and differential-mode filtering circuits and the like.

BACKGROUND OF THE INVENTION

A variety of power converters are used throughout industry. Power converters are often utilized in electronic circuits for direct current (DC) or alternate current (AC) conversion to supply power to electric motors. Such conversion is performed on hybrid electric vehicles, fan drives, washing machines, refrigerators, and other various machines and equipment to improve efficiency and performance, as well as to minimize noise.

Certain electronic circuits exhibit high switching speeds. At high switching speed, the electronic circuits generate common-mode (CM) and differential-mode (DM) electromagnetic interference (EMI) noises. Thus, CM and DM filters are incorporated to remove such noise. The theoretically simplest filter topologies include capacitors and inductors that are without mutual-couplings between windings. However, in actual implementation, the inductors are normally with mutually coupled windings to minimize inductor size. Depending on the coupling polarity to the inductors and the number of inductors used, the CM or DM noises can be effectively blocked. Traditionally, a first inductor is used to filter CM noises and a second inductor is used to filter DM noises. A single traditional inductor is not effective in simultaneously filtering both CM and DM noises, due to the structure thereof.

There is a desire to further reduce the circuit size, cost, complexity, and weight associated with CM and DM inductor filtering. Thus, there is a need for an improved technique of providing CM and DM inductor filtering.

SUMMARY OF THE INVENTION

In one embodiment of the present invention an inductor is provided that includes a core with a window. The core includes a first core member and a second core member. A first winding is coupled to the first core member and a second winding is coupled to the second core member. One or more cross-member(s) are coupled at least partially across and are conductively enabling flux flow between the first core member and the second core member.

In another embodiment of the present invention an electronic circuit is provided that includes an input terminal, an inductor, and an output terminal. The inductor is coupled to the input terminal and has only a single inductive core. The inductor is coupled to filter both common-mode noise and differential-mode noise. The output terminal is coupled to and receives filtered common-mode and differential-mode current from the inductor.

The embodiments of the present invention provide several advantages. One advantage provided by an embodiment of the present invention is a circuit having a single inductor that provides both common-mode and differential-mode filtering of electromagnetic interference noises.

The present invention is versatile in that it provides configurations that may be utilized and varied among a diverse range of applications, electronic circuits, and industries.

In addition, the present invention reduces the size, weight, and complexity of an electromagnetic interference filtering circuit and as such the costs associated therewith.

The present invention itself, together with further objects and attendant advantages, will be best understood by reference to the following detailed description, taken in conjunction with the accompanying drawing.

BRIEF DESCRIPTION OF THE DRAWINGS

For a more complete understanding of this invention reference should now be had to the embodiments illustrated in greater detail in the accompanying figures and described below by way of examples of the invention wherein.

DETAILED DESCRIPTION

Figure 1:
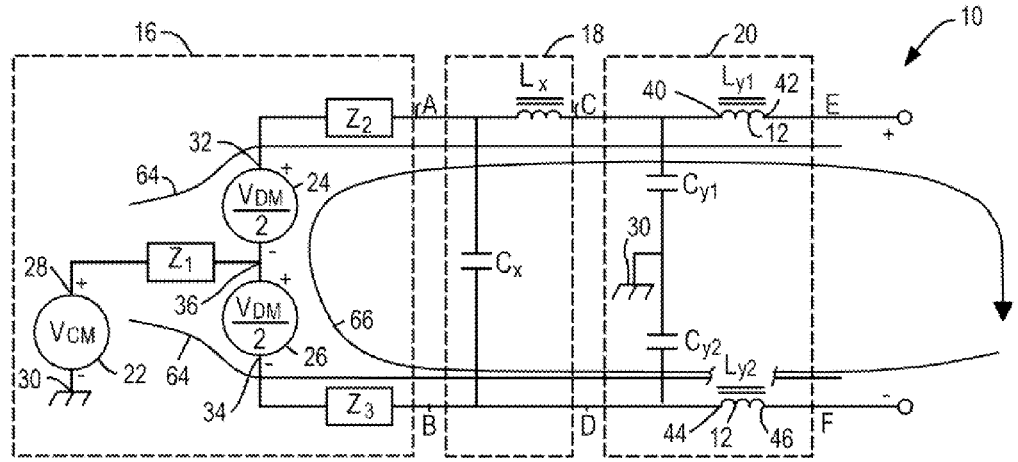
FIG. 1 is a schematic view of a traditional electronic circuit incorporating common-mode and differential-mode filtering with inductors having single-coupled windings.
Figure 2:
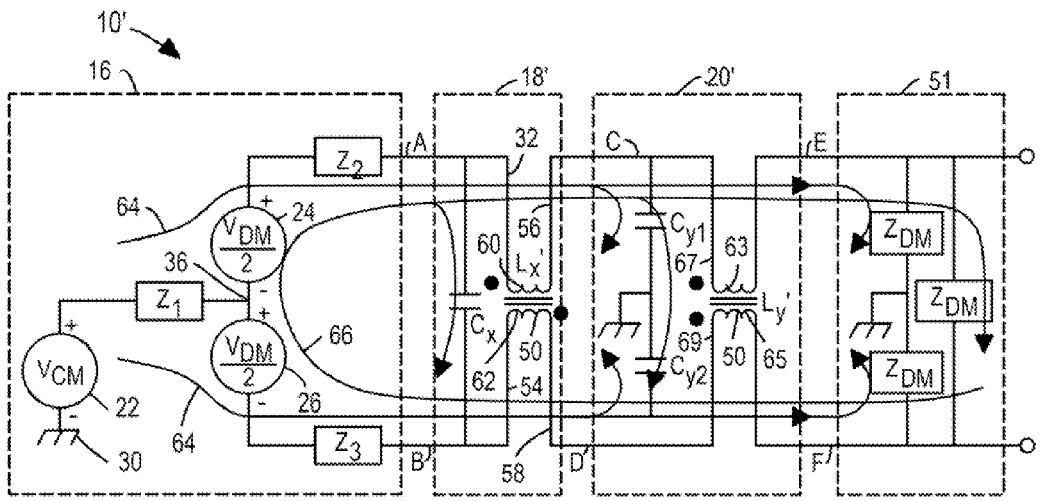
FIG. 2 is a schematic view of a traditional electronic circuit incorporating common-mode and differential-mode filtering with inductors having dual-coupled windings.

In the following described FIGS. 1 and 2 typical common-mode (CM) and differential-mode (DM) filter topologies are shown for the reduction of electromagnetic interference (EMI) noise emission. FIG. 1 illustrates a simple filter topology that includes capacitors and inductors without mutually coupled windings. FIG. 2 illustrates a filter topology with inductors that have mutually coupled windings.

Referring now to FIG. 1, a schematic view of a traditional electronic circuit 10 that incorporates CM and DM filtering, with inductors 12 that have single-coupled windings, is shown. The circuit 10 includes an EMI source circuit 16 and a pair of inductor-based filtering circuits, namely, a DM filtering circuit 18, and a CM filtering circuit 20.

The EMI source circuit 16 has a CM source 22, which represents CM EMI noise generated by EMI circuit 16, and a pair of DM sources 24, 26, which represent DM EMI noise generated by EMI circuit 16. The CM source 22 has a CM terminal 28 and a ground terminal 30. The EMI source circuit may be in the form of a power source, a load, or a combination thereof. The DM sources 24, 26 have positive DM terminals 32 and negative DM terminals 34. Impedance between the CM source 22 and the DM sources 24, 26 is shown and represented as a first impedance $Z_1$. The impedance $Z_1$ is coupled between the CM terminal 28 and a DM terminal 36, which is in turn coupled between the DM sources 24, 26. Impedances between the DM sources 24, 26 and the DM filtering circuit 18 are shown and represented, respectively, as a second impedance $Z_2$ and a third impedance $Z_3$. The EMI circuit 16 has a terminal A and a terminal B, which are coupled to the impedances $Z_2$ and $Z_3$, respectively.

The DM filtering circuit 18 includes a DM capacitor $C_x$ and a DM inductor $L_x$. The DM capacitor $C_x$ is coupled to and across the terminals A and B and in parallel to the DM sources 24, 26. The DM inductor $L_x$ has a single winding that is coupled in series with the second impedance $Z_2$ and post the DM capacitor $C_x$. The DM filtering circuit 18 has DM terminals C and D that are coupled to the DM inductor $L_x$ and to the terminal B and the DM capacitor $C_x$.

The CM filtering circuit 20 includes a pair of CM capacitors $C_{y1}$ and $C_{y2}$ and a pair of CM inductors $L_{y1}$ and $L_{y2}$. The CM capacitors $C_{y1}$ and $C_{y2}$ are coupled in series with each other and are coupled in parallel with the DM capacitor $C_x$. Each of the CM capacitors $C_{y1}$ and $C_{y2}$ is coupled to either the DM terminal C or the DM terminal D and to ground. The first CM inductor $L_{y1}$ is coupled to the DM terminal C and to the first CM capacitor $C_{y1}$, on a first end 40, and to a CM terminal E, on a second end 42. The second CM inductor $L_{y2}$ is coupled to the DM terminal D and to the second CM capacitor $C_{y2}$, on a first end 44, and to a CM terminal F, on a second end 46. The CM terminals E and F may be input terminals or output terminals and may be coupled to a load, a power source, or a combination thereof. The location of the DM filter 18 and the CM filter 20 may be swapped or interchanged. In other words, the CM filter 20 may be directly connected to the circuit 16 and the DM filter 18 may be connected between the CM filter 20 and the terminals E, F.

Referring now to FIG. 2, a schematic view of a traditional electronic circuit 10' that incorporates CM and DM filtering, with inductors 50 that have dual-coupled windings, is shown. The electronic circuit 10' is similar to the electronic circuit 10. However, the single winding DM inductor $L_x$ is replaced with a dual-winding DM inductor $L_x'$ and the DM filtering circuit 18' is configured as such. The inductor $L_x'$ has a first differential inductor terminal 52 that is coupled to the terminal A, a second differential inductor terminal 54 that is coupled to the DM terminal B, a third differential inductor terminal 56 that is coupled to the DM terminal C, and a fourth differential inductor terminal 58 that is coupled to the terminal D. The first terminal 52 and the third terminal 56 are associated with a first differential winding 60. The second terminal 54 and the fourth terminal 58 are associated with a seconding differential winding 62. Also, the CM inductors $L_{y1}$ and $L_{y2}$ are replaced with a single dual-winding CM inductor $L_y'$ and the CM filtering circuit 20' is configured as such. The CM inductor $L_y'$ has a first common winding 63 that is coupled between the terminals C and E and a second common winding 65 that is coupled between the terminals D and F. Terminals 67 and 69 of the CM inductor $L_y'$ are coupled to the DM terminals C and D, respectively. The electronic circuit 10' also includes a load circuit 51 with DM load impedances $Z_{DM}$ and CM load impedances $Z_{cm}$. Similarly, the location of the DM filter 18 and the CM filter 20 may be interchanged. In other words, the CM filter 20 may be connected to the circuit 16 and the DM filter 18 may be connected between the CM filter 20 and the terminals E, F.

Referring now to FIGS. 1 and 2, in which CM and DM noise conduction is shown. CM noise is conducted directly from the CM source 22 to the terminals E and F on all lines, or through and inward from highest potential and lowest potential branches, of the electronic circuits 10 and 10'. The conduction of the CM noise is represented by the CM noise lines 64. DM noise is conducted in a current loop like fashion from the negative or lower potential points in the electronic circuits 10 and 10' to the positive or higher potential points in the electronic circuits 10 and 10'. The conduction of the DM noise is represented by the DM noise lines 66.

Although the combined sizes of inductors $L_x'$ plus $L_y'$ are smaller in size than the sum of inductors $L_x$, $L_{y1}$, and $L_{y2}$, they are similar in that they are each only effective in blocking either CM or DM noises. The coupling polarity of the mutual winding inductors determines the filtering characteristics of that inductor or whether the inductor is a CM or DM filtering inductor.

Figure 3:
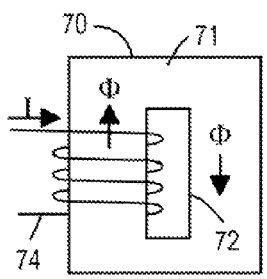
FIG. 3 is a side view of a traditional inductor having a single window and a single winding.
Figure 4:
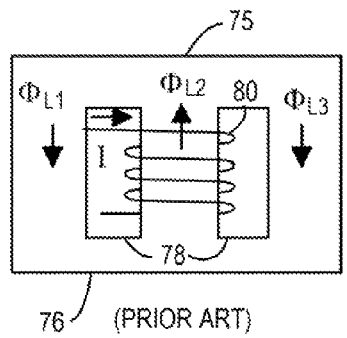
FIG. 4 is a side view of another traditional inductor a pair of windows and a single winding.
Figure 5:
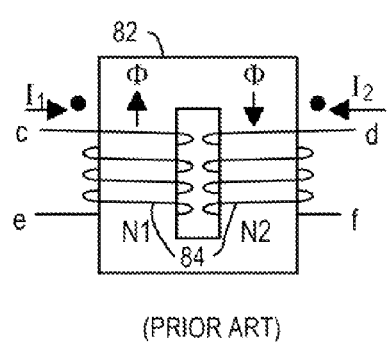
FIG. 5 is a side view of another traditional inductor having a single window and a pair of windings.

Referring now also to FIGS. 3-5, in which side views of traditional inductors are shown. FIGS. 3-5 are herein included as illustrated examples along with the following explanations associated therewith that provides reasons for which traditional inductors are incapable of exhibiting both CM and DM filtering characteristics. In FIG. 3 an inductor 70 that has a continuous core 71 having a single window 72 and a single winding 74 is shown. In FIG. 4 an inductor 75 that has a continuous core 76 having two windows 78 and a single winding 80 is shown. The structures of the inductors 70 and 75 of FIGS. 3 and 4 provide only DM filtering. The structures are incapable of blocking CM noises since they have only a single winding. On the other hand, the dual-winding inductor 82 of FIG. 5 can be coupled to perform as either an effective CM or a DM filtering device, but not simultaneously. Note also that the presence of multiple windings does not imply the ability to block both DM and CM noises. Dual-winding configurations of the embodiments of the present invention are provided below that exhibit both DM and CM noise filtering characteristics.

The dual-winding inductor 82 includes terminals c, d, e, and f and may serve as a two-terminal DM inductor or as a four-terminal DM inductor. To serve as a two-terminal DM inductor, the inductor terminals d and e are connected together, while the inductor terminals c and f serve as the external terminals. To serve as a four-terminal DM inductor, the inductor terminals c, d, e, and f are mapped, for example, to the terminals A, D, C, and B, respectively, of FIG. 2. Under this arrangement, the DM current induces superimposed magneto-motive forces (mmfs) with high core flux and inductance. On the other hand, the CM current through the windings 84 of the dual-winding inductor 82 induces mutually canceling mmfs, therefore, with low actual flux and inductance.

To perform as a CM inductor, the dual-winding inductor 82 is configured and serves as a CM choke. In comparison with the above four-terminal DM inductor approach, the polarity of one winding of the dual-winding inductor is reversed. For example, the inductor terminals d and f may be swapped to couple terminals B and D, respectively. Under this arrangement, the dual-winding inductor 82 exhibits high CM inductance but low DM impedance.

The present invention overcomes the limitations of traditional inductor approaches and is described in detail below.

In each of the following figures, the same reference numerals are used to refer to the same components. The present invention may apply to automotive, aeronautical, nautical, and railway applications, as, well as to other applications in which substantial CM and DM filtering is desired simultaneously. The present invention may be applied in commercial and non-commercial settings. The present invention may be applied in appliances, in trailers, off-highway equipment, in auxiliary equipment, in communication systems, and in a variety of other applications or settings.

Also, a variety of other embodiments are contemplated having different combinations of the below described features of the present invention, having features other than those described herein, or even lacking one or more of those features. As such, it is understood that the invention can be carried out in various other suitable modes.

In the following description, various operating parameters and components are described for one constructed embodiment. These specific parameters and components are included as examples and are not meant to be limiting.

Figure 6:
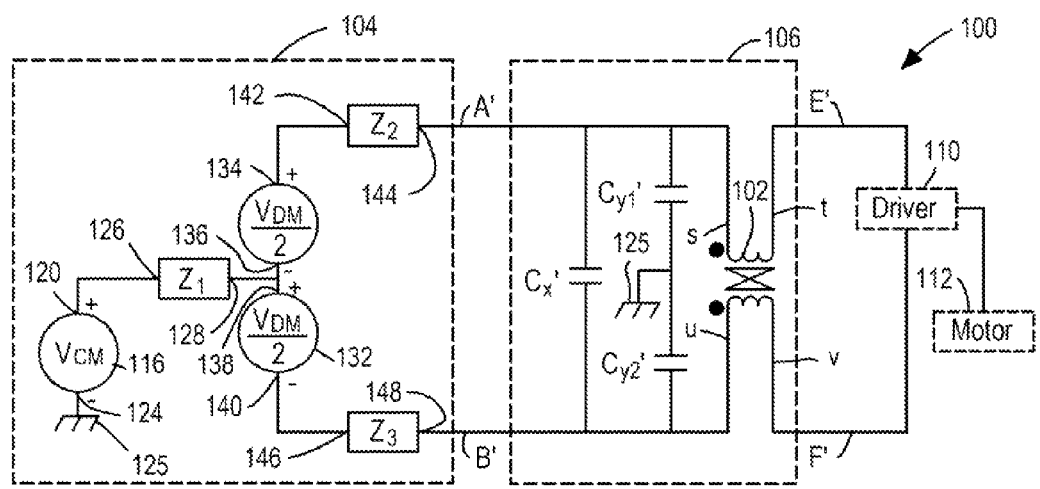
FIG. 6 is a sample electronic circuit incorporating a dual-mode filtering inductor in accordance with an embodiment of the present invention.

Referring now to FIG. 6, a sample electronic circuit 100 incorporating a dual-mode filtering inductor 102 in accordance with an embodiment of the present invention is shown. The electronic circuit 100 includes an EMI source circuit 104, a dual-mode filtering circuit 106, and terminals E' and F', which may perform as output terminals and be coupled to one or more drivers 110 and, respective one or more motors 112 (only one driver and motor are shown), as shown. The terminals E and F may, in addition or in the alternative to be coupled to a load, or be coupled to a power source. Also, the terminals E and F may be used as input terminals, depending upon the application. Note that the arrangement, coupling, and configuration of the components of the electronic circuit 100 is provided only as an example, an infinite number of other electrical circuit arrangements, couplings, and configurations may be formed utilizing a dual-mode filtering inductor. Although the electronic circuit is shown in the form of a DC dual-filtered drive circuit, and as such the dual-mode inductor 102 is described in respect thereto, the dual-mode inductor 102 may be utilized and incorporated into other electronic circuits known in the art that have a need for DM and CM filtering. Also, an inductor symbol is provided in FIG. 6 to represent the use of a dual-mode filtering inductor. The provided symbol does not refer to one particular dual-mode filtering inductor, but rather signifies that any one of the dual-mode filtering inductors described herein or devised via the teachings herein may be utilized in the electronic circuit 100.

The EMI circuit 104 includes a CM noise source 116, which represents the CM noise generated by the EMI circuit 104. The CM source 116 has a supply terminal 120 and a ground terminal 124. The supply terminal 120 is coupled in series with a first impedance $Z_1'$. The ground terminal 124 is coupled to the ground 125. The first impedance $Z_1'$ has first impedance terminals 126 and 128. The first impedance terminal 126 is coupled to the supply terminal 120. The first impedance terminal 128 is coupled to a pair of DM noise sources 130, 132, which represent the DM noise conducted in the EMI circuit 104. The first DM source 130 has first DM terminals 134 and 136. The first DM terminal 136 is coupled to the first impedance terminal 128. The second DM source 132 has second DM terminals 138 and 140. The second DM terminal 138 is coupled to the first impedance terminal 128. The first DM terminal 134 is coupled to a source terminal A' through impedance Z2. The second DM terminal 140 is coupled to a source terminal B' through impedance Z3.

A second impedance Z2' and a third impedance Z3' are coupled to the DM sources 130, 132. The second impedance Z2' has second impedance terminals 142 and 144. The third impedance Z3' has third impedance terminals 146 and 148. The second impedance terminal 142 is coupled to the first DM source terminal 134. The third impedance terminal 146 is coupled to the second DM source terminal 140.

The dual-mode filtering circuit 106 includes CM and DM capacitors and the dual-mode inductor 102. A differential capacitor $C_x'$ is coupled in parallel with the DM sources 130, 132 and between the second impedance terminal 144 and the third impedance terminal 148 on the terminals A' and B'. A pair of CM capacitors $C_{y1}'$ and $C_{y2}'$ are coupled in series with each other and combined in parallel to the DM capacitor $C_x'$. The first CM capacitor $C_{y1}'$ is coupled between the terminal A' and ground 125. The second CM capacitor $C_{y2}'$ is coupled between ground 125 and the terminal B'.

The dual-mode inductor 102 has and/or is coupled to inductor terminals s, u, t, and v. The inductor terminals s and u are coupled to the terminals A' and B', respectively. The inductor terminals t and v are coupled to the electronic circuit terminals E' and F'. Terminals E' and F' may perform as input or output terminals, depending upon the application.

In the following FIGS. 7A and 7B, inductor topologies and representations are provided for the example inductors of FIGS. 8-14.

Figure 7A:
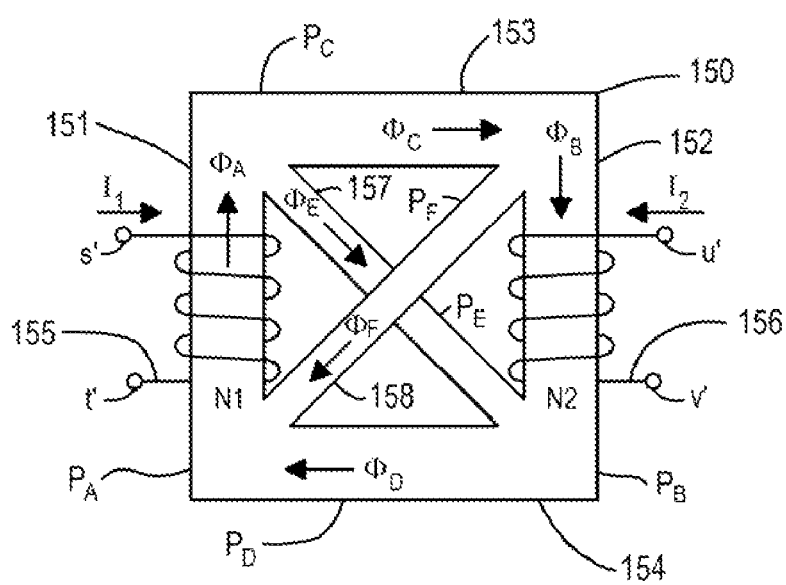
FIG. 7A is a side magnetic flux flow representation of a dual-mode filtering inductor in accordance with an embodiment of the present invention.
Figure 7B:
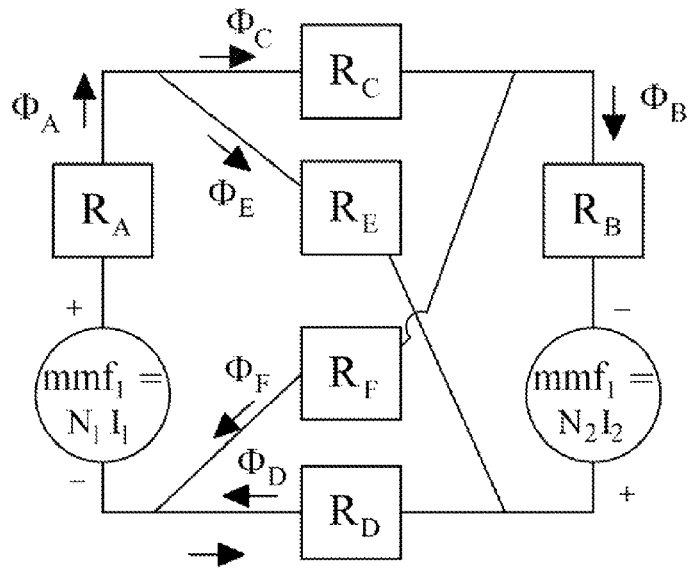
FIG. 7B is a schematic view of a magnetic equivalent circuit of the dual-mode filtering inductor described with respect to FIG. 7A.

Referring now to FIGS. 7A and 7B, a side magnetic flux flow representation of a dual-mode inductor and a side schematic view of a magnetic equivalent circuit thereof are shown. The dual-mode inductor has a core 150 with wound core members 151, 152 and lateral members 153, 154. A pair of windings 155, 156 are wound on the wound core members 151, 152, respectively. A pair of cross flux flow members 157, 158 are coupled between diagonally opposite ends of the wound core members. The windings 155, 156 have terminals s', t', u', and v', which may be mapped to terminals s, t, u, and v of FIG. 6, respectively.

With two windings and two cross-members, the dual-mode inductor provides six magnetic internal flux paths $P_A$, $P_B$, $P_C$, $P_D$, $P_E$, and $P_F$ having associated magnetic flux therein, represented and designated by $\Phi_A$, $\Phi_B$, $\Phi_C$, $\Phi_D$, $\Phi_E$, and $\Phi_F$. The first core member 151 performs as flux path $P_A$ and has flux $\Phi_A$, the second core member 152 performs as flux path $P_B$ and has flux $\Phi_B$, the first lateral member 153 performs as flux path $P_C$ and has flux $\Phi_C$, the second lateral member 154 performs as flux path $P_D$ and has flux $\Phi_D$, the first cross-member 157 performs as flux path $P_E$ and has flux $\Phi_E$, and the second cross-member 158 performs as flux path $P_F$ and has flux $\Phi_F$. FIG. 7B shows the equivalent magnetic circuit for the dual-mode inductor, where the magneto-motive forces (mmfs) are modeled as equivalent voltage sources and the core reluctances are modeled as resistances. The equivalent voltage sources are approximately equal to the product of the number of turns of the windings on the core member of concern and the current through that winding. The number of turns of the windings, for the dual-mode inductor, are represented by $N_1$ and $N_2$ and the currents are represented by $I_1$ and $I_2$. Each of the core members 151, 152, 153, 154 and the cross-members 157, 158 has an associated reluctance $R_A$, $R_B$, $R_C$, $R_D$, $R_E$, and $R_F$.

The flux through each branch or member in the dual-mode inductor can be calculated by known circuit theories. The below equations are provided assuming that the dual-mode inductor is symmetrical, such that the number of windings $N_1$ and $N_2$ are equal, the reluctance $R_A$ is equal to the reluctance $R_B$, the reluctance $R_C$ is equal to the reluctance $R_D$, and the reluctance $R_E$ is equal to the reluctance $R_F$. X and Y component current variables $I_X$ and $I_Y$ are defined based on combinations of winding currents $I_1$ and $I_2$ and are provided by equations 1-4.

$$I_X = \frac{I_1 + I_2}{2} \quad (1)$$

$$I_Y = \frac{I_1 - I_2}{2} \quad (2)$$

$$I_1 = I_X + I_Y \quad (3)$$

$$I_2 = I_X - I_Y \quad (4)$$

When only the X flux current component exists, flux $\Phi_A$, flux $\Phi_B$, flux $\Phi_C$, and flux $\Phi_D$ are equal, and flux $\Phi_E$ and flux $\Phi_F$ are equal to zero. As such, flux $\Phi_X$ is provided by equation 5.

$$\Phi_X = \frac{NI_X}{R_A + R_C} \quad (5)$$

From equation 5 the inductance $L_x$ can be determined by equation 6.

$$L_X = \frac{N\Phi_X}{I_X} = \frac{N^2}{R_A + R_C} \quad (6)$$

On the other hand, when only the Y flux current component exists, flux $\Phi_A$, the inverse of flux $\Phi_B$, flux $\Phi_E$, and flux $\Phi_F$ are equal, and flux $\Phi_C$ and flux $\Phi_D$ are equal to zero. As such, flux $\Phi_y$ is provided by equation 7 and the inductance $L_y$ is provided by equation 8.

$$\Phi_Y = \frac{NI_Y}{R_A + R_E} \quad (7)$$

$$L_Y = \frac{N\Phi_Y}{I_Y} = \frac{N^2}{R_A + R_E} \quad (8)$$

Equations 6 and 8 show that the inductances $L_X$ and $L_Y$ can be determined independently. Also, if the currents include the X and Y components, according to equations 3 and 4, the windings 155, 156 are sized to handle the sum, or the difference, of both components. Similarly, by combining equations 5 and 7, the core paths $P_A$ and $P_B$ are sized to handle the sum, or the difference, of the X and Y flux components. The core paths $P_C$ and $P_D$ are sized to handle the X-component. The core paths $P_E$ and $P_F$ are sized to pass the Y-component.

Figure 9:
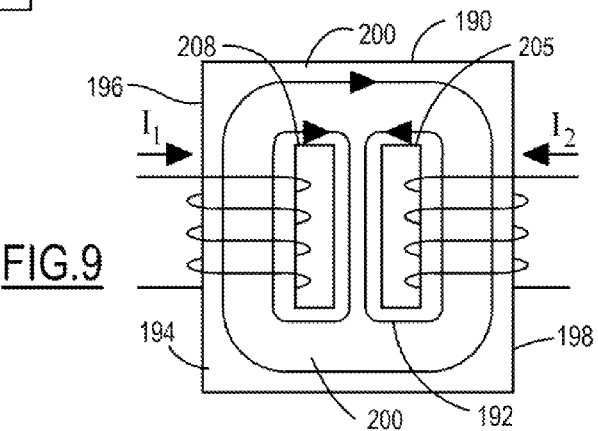
FIG. 9 is a side view of another dual-mode filtering inductor incorporating a single non-wound center leg in accordance with another embodiment of the present invention.
Figure 10:
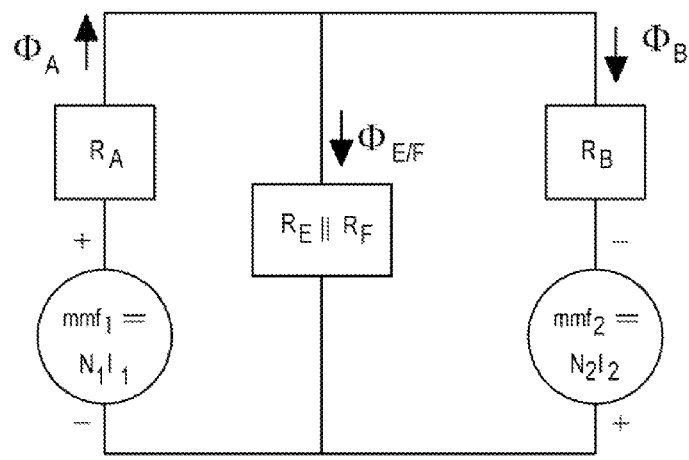
FIG. 10 is a side schematic view of a magnetic equivalent circuit of the dual-mode filtering inductor of FIG. 9.

In certain cases, some of the core members may have zero or infinite reluctance. For example, if the reluctance $R_C$ and the reluctance $R_D$ are equal to zero, the topology of the dual-mode inductor becomes as shown in FIGS. 9 and 10.

Note that in the following FIGS. 8-14 dual-mode filtering inductors are provided that having a particular number of members, windings, cross-members, and windows, these are examples only. Other combinations may be formed having varying numbers of members, windings, cross-members, and windows.

Figure 8:
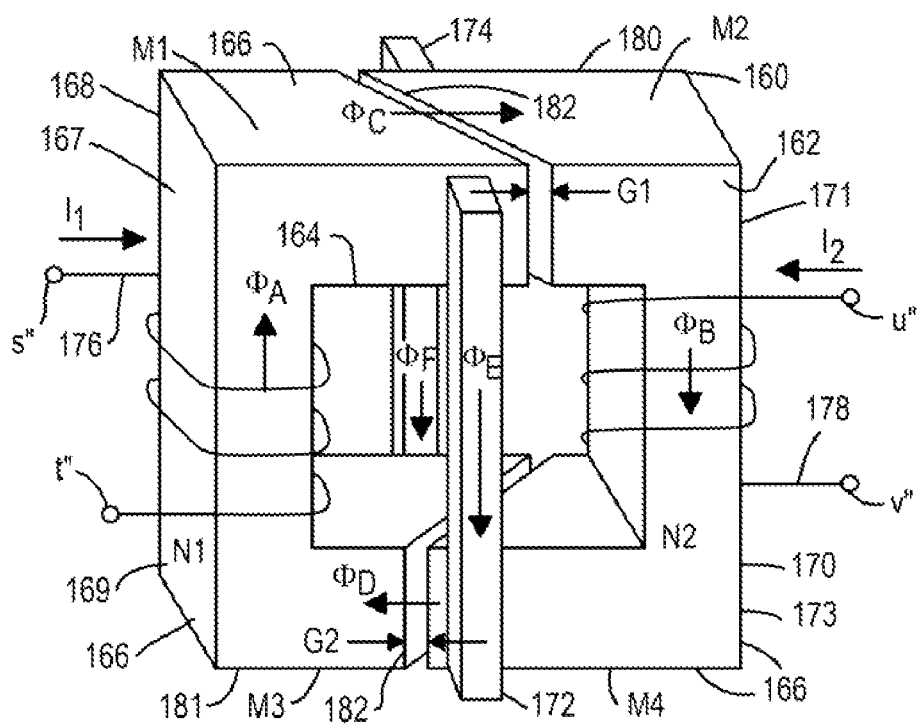
FIG. 8 is a perspective view of a dual-mode filtering inductor in accordance with an embodiment of the present invention.

Referring now to FIG. 8, a perspective view of a dual-mode filtering inductor 160 in accordance with an embodiment of the present invention is shown. Although many of the features of the inductor 160 are below described with "input" and "output" designations, these are relative terms and depending upon the application, the stated designations may be reversed. For example, the winding terminals of the inductor that are coupled to receive input current determines which winding terminals are input terminals and which are output terminals and, similarly, which core member ends are input ends and which are output ends.

The dual-mode inductor 160 has a core 162 with a window 164. In general, the core 162 includes multiple legs or members 166. For the embodiment shown, the core 162 has a first wound core member 168 and a second wound core member 170. The first core member 168 and the second core member 170 are coupled to each other via a pair of cross-members 172, 174. The cross-members 172, 174 are coupled across the window 164 and provide an increased number of magnetic flux flow paths over traditional inductors.

The first core member 168 has a first conductive element winding 176 and a first core input end 167 and a first core output end 169 on either side of the first winding 176. The second core member 170 has a second conductive element winding 178 and a second core input end 171 and a second core output end 173 on either side of the second winding 178. The windings 176, 178 have terminals s", t", u", and v", which may be mapped to terminals s, t, u, and v of FIG. 6, respectively.

A pair of lateral core members 180, 181 is coupled between the wound core members 168 and 170. The lateral members 180, 181 are integrally formed as part of the core 162, along with the wound core members 168 and 170. The first lateral member 180 is coupled to and between the first output end 167 and the second input end 171. The second lateral member 181 is coupled to and between the first input end 169 and the second output end 173. Each of the lateral members 180 and 181 has a break 182 such that the core 162 is split. The breaks 182 in the lateral members 180, 181 form the four lateral elements M1, M2, M3, and M4. The elements M1 and M2 are coupled to the first core member 168 and the second core member 170. Similarly, the elements M3 and M4 are also coupled to the first core member 168 and the second core member 170. A first gap G1 exists between the elements M1 and M2. A second gap G2 exists between the elements M3 and M4. The gaps G1 and G2 provide low permittivity to prevent current saturation at full load. The gaps G1 and G2 or other additional gaps may be of various sizes and shapes, and may be filled with other materials to adjust the effective permeability of the core or other characteristics. A few other inductor dual-mode filtering examples having different gapped configurations are provided below with respect to FIGS. 11-14.

The cross-members 172 and 174 may have a variety of associated sizes, shapes, and configurations. The first cross-member 172 is coupled to the diagonally opposite ends 167 and 173 via the elements M1 and M4. The second cross-member 174 is coupled to the diagonally opposite ends 169 and 171 via the elements M2 and M3.

The core 162, the core members 168 and 170, the elements M1-M4, and the cross-members 172 and 174, and the windings 176, 178 may be formed of materials commonly associated with an inductor. The core 162 may be formed of iron, iron powder, ferrite, or other suitable core materials or material combinations. The windings 176, 178 may be formed of copper, aluminum, gold, silver, or other suitable winding materials or material combinations.

Referring now to FIGS. 9 and 10, a side view of another dual-mode filtering inductor 190 that incorporates a single non-wound center leg 192 and a side schematic view of the magnetic equivalent circuit thereof in accordance with another embodiment of the present invention is shown. The dual-mode inductor 190 represents a special case of the dual-mode inductor 160 with zero impedance along the paths $P_C$ and $P_D$. It has a core 194 with a first core wound member 196, a second core wound member 198, and lateral members 200. The impedance of the lateral members 200 may be divided and lumped together respectively with that of core members 194 and 198. The non-wound center leg 192 has windows 203 and 205 on either side thereof. The first core wound member flux $\Phi_A$ and associated reluctance $R_A$, the second core wound member flux $\Phi_B$ and associated reluctance $R_B$, and the center member flux $\Phi_{E/F}$ and associated reluctance $R_{E/F}$ are shown in FIG. 10.

When the Y-component current $I_Y$ is equal to zero, then the X-component flux $\Phi_X$ and the inductance $L_X$ are as provided in equations 9 and 10 where the flux $\Phi_{E/F}$ is equal to zero.

$$\Phi_X = \frac{NI_X}{R_A} = \Phi_A = \Phi_B \quad (9)$$

$$L_X = \frac{N\Phi_X}{I_X} = \frac{N^2}{R_A} \quad (10)$$

On the other hand, when the X-component current $I_x$ is equal to zero, the Y-component flux $\Phi_Y$ and the inductance $L_y$ are as provided in equations 11 and 12.

$$\Phi_Y = \frac{\Phi_{E/F}}{2} = \frac{NI_Y}{R_A + 2R_C} = \Phi_A = -\Phi_B \quad (11)$$

$$L_Y = \frac{N\Phi_Y}{I_Y} = \frac{N^2}{R_A + 2R_C} \leq L_X \quad (12)$$

The inductance $L_Y$ is equal or smaller than the inductance $L_X$, and the core path $P_{E/F}$ is sized to accommodate the Y-component.

In the following FIGS. 11-14, additional example implementations of dual-mode filtering inductors are provided. The X flux components and the Y flux components are shown in each of FIGS. 11-14 for each of the associated dual-mode filtering inductors. The X flux components are shown by the flow lines 206, respectively. The X flux components are shown by the flow lines 208, respectively.

Figure 11:
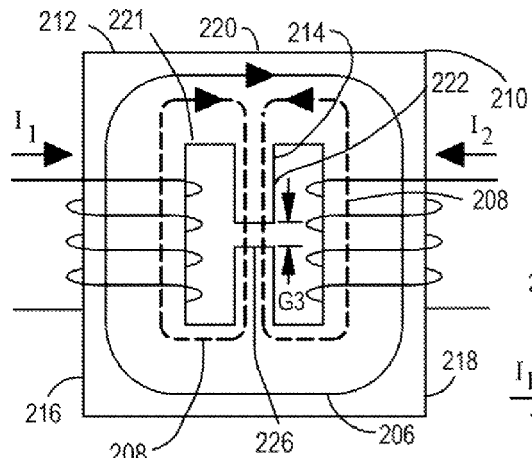
FIG. 11 is a side view of another dual-mode filtering inductor incorporating a core having a split center leg in accordance with another embodiment of the present invention.

Referring now to FIG. 11, a side view of another dual-mode filtering inductor 210 that incorporates a continuous core 212 with a split center leg 214 is shown in accordance with another embodiment of the present invention. The core 212 has wound core members 216, 218, lateral members 220, and a single window 221. The center leg 214 is coupled between the lateral members 220 and has a first center element 222 and a second center element 224. The center leg 214 also has a break 226 with an associated gap G3 between the first center element 222 and the second center element 224. The gap G3 may be filled with materials to adjust the effective permeability of the core or other characteristics thereof.

Figure 12:
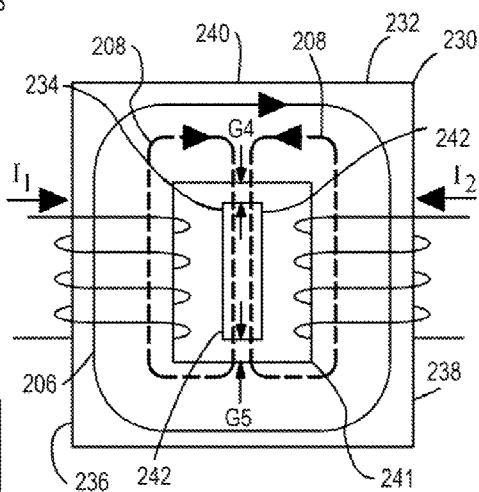
FIG. 12 is a side view of another dual-mode filtering inductor incorporating a core surrounded and floating center leg in accordance with another embodiment of the present invention.

Referring now to FIG. 12, a side view of another dual-mode filtering inductor 230 that incorporates a core 232 within a surrounded and floating center leg 234 is shown in accordance with another embodiment of the present invention. The dual-mode inductor 230 also has a continuous core with wound core members 236, 238 and lateral members 240. The floating center leg 234 is coupled between, but is not attached to the lateral members 240, and is within the window 241. A pair of gaps G4 and G5 exists between the longitudinal ends 242 of the floating center leg 234 and the lateral members 240. Although a pair of gaps are shown along the center leg 234, any number of gaps may be incorporated. Also, gaps may be included along the core 232. In addition, the gaps may be filled with materials to adjust the effective permeability of the core or other characteristics thereof.

Figure 13:
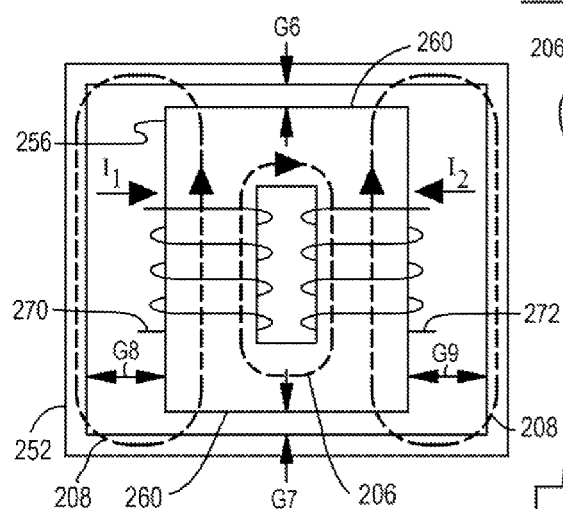
FIG. 13 is a side view of another dual-mode filtering inductor having an outer flux flow enabling shell in accordance with another embodiment of the present invention.

Referring now to FIG. 13, a side view of another dual-mode filtering inductor 250 that has an outer flux flow enabling shell 252 is shown in accordance with another embodiment of the present invention. The dual-mode inductor 250 includes a continuous core 254 with wound core members 256, 258 and lateral members 260. The shell 252 surrounds the core 254. A pair of small gaps G6 and G7 exist between the lateral members 260 and the shell 252 and a pair of large gaps G8 and G9 exist between the wound core members 256, 258 and the shell 252. Instead of providing additional flux paths via a center leg, the dual-mode inductor 250 provides additional flux paths via the shell 252. Flux created by the passage of current through the windings 270, 272 creates magnetic flux that circulates through the wound core members 256, 258 and the shell 252, as shown. The I flux components circulate over or across the small gaps G6 and G7. Similarly, the shell 252 may formed or consist of multiple sections with gaps therebetween. Again the gaps may be filled with a variety of materials.

Figure 14:
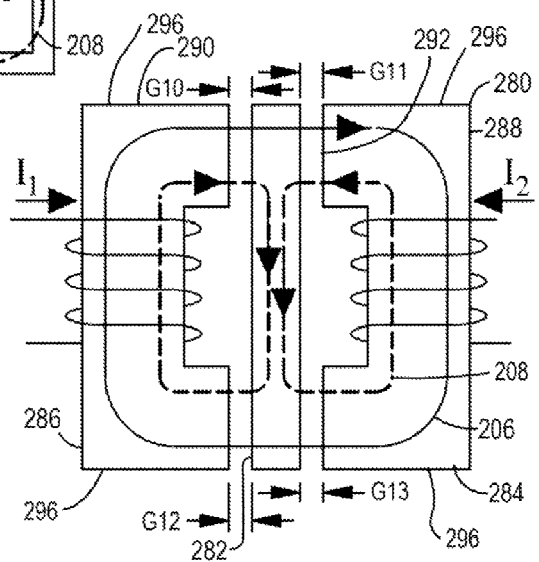
FIG. 14 is a side view of another dual-mode filtering inductor having core dividing center member in accordance with another embodiment of the present invention.

Referring now to FIG. 14, a side view of another dual-mode filtering inductor 280 that has a core dividing center member 282 in accordance with another embodiment of the present invention is shown. The dual-mode inductor 280 includes a non-continuous core 284 that has wound core members 286, 288 and lateral members 290 with breaks 292, 294. The center member 282 is isolated from or not in contact with the lateral members 290, divides the window 291, and is disposed within the gaps associated with the breaks 292, 294. The center member 282 extends between the lateral members 290 and is coupled between lateral elements 296 of each lateral member 290. Gaps G10, G11, G12, and G13 exist between each of the lateral elements 296 and the center member 282.

The present invention provides a multiple dual-mode filtering inductors and associated electronic circuits for diverse applications. The stated inductors and circuits reduce the number of inductors needed to provide both common-mode and differential-mode filtering.

While the invention has been described in connection with one or more embodiments, it is to be understood that the specific mechanisms and techniques which have been described are merely illustrative of the principles of the invention, numerous modifications may be made to the methods and apparatus described without departing from the spirit and scope of the invention as defined by the appended claims.

What is claimed is:

1. A dual mode filtering inductor comprising:
   a continuous core member having a window;

a first winding coupled to said continuous core member;

a second winding coupled to said continuous core member;

a shell surrounding said continuous core member wherein flux circulates through the core and the shell;

a first pair of gaps between a lateral member of said continuous core member and said shell;

a second pair of gaps between a longitudinal member of said continuous core member and said shell; and wherein the second pair of gaps are larger than the first pair of gaps.

2. An inductor as claimed in claim 1 wherein said shell further comprises a plurality of shell sections having gaps therebetween.

3. An inductor as claimed in claim 1 wherein said shell further comprises a plurality of shell sections having gaps therebetween.

* * * * *